US012610556B2

(12) United States Patent
Chang et al.

(10) Patent No.: US 12,610,556 B2
(45) Date of Patent: Apr. 21, 2026

(54) SEMICONDUCTOR DEVICE AND METHOD FOR MANUFACTURING SAME

(71) Applicant: CHANGXIN MEMORY TECHNOLOGIES, INC., Hefei City (CN)

(72) Inventors: Wei Chang, Hefei (CN); Qingsong Du, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 964 days.

(21) Appl. No.: 17/810,590

(22) Filed: Jul. 1, 2022

(65) Prior Publication Data

US 2023/0269952 A1 Aug. 24, 2023

Related U.S. Application Data

(63) Continuation of application No. PCT/CN2022/085934, filed on Apr. 8, 2022.

(30) Foreign Application Priority Data

Feb. 22, 2022 (CN) .......................... 202210160864.4

(51) Int. Cl.
*H10B 63/00* (2023.01)
*H10N 70/00* (2023.01)

(52) U.S. Cl.
CPC ........... *H10B 63/20* (2023.02); *H10N 70/011* (2023.02)

(58) Field of Classification Search
CPC ........ H10B 63/00; H10N 70/00; H10D 62/10; H10D 84/01
See application file for complete search history.

(56) References Cited

U.S. PATENT DOCUMENTS

| | | | |
|---|---|---|---|
| 2010/0117048 A1 | 5/2010 | Lung | |
| 2010/0117049 A1 | 5/2010 | Lung | |
| 2018/0006086 A1 | 1/2018 | Chiu et al. | |
| 2019/0221611 A1 | 7/2019 | Cao et al. | |
| 2020/0144496 A1 | 5/2020 | Glassman et al. | |

FOREIGN PATENT DOCUMENTS

| | | | | |
|---|---|---|---|---|
| CN | 101740602 A | | 6/2010 | |
| CN | 107579087 A | * | 1/2018 | ............. H10B 63/80 |
| CN | 110047867 A | | 7/2019 | |

OTHER PUBLICATIONS

X. A. Tran, et al., "A Self-Rectifying HfOx-Based Unipolar RRAM With NiSi Electrode", IEEE Electron Device Letters, 33(4), 585-587. doi:10.1109/led.2011.2181971, Apr. 2012.

* cited by examiner

*Primary Examiner* — Marvin Payen
(74) *Attorney, Agent, or Firm* — Syncoda LLC; Feng Ma

(57) ABSTRACT

A semiconductor device includes: a semiconductor substrate and a memory cell located on a surface of the semiconductor substrate; the semiconductor substrate comprises a well area, an isolation structure, a first doped area and a second doped area; the isolation structure, the first doped area and the second doped area are located in the well area, and the isolation structure at least is located between the first doped area and the second doped area; the memory cell is located on a top surface of the second doped area and is electrically connected with the second doped area.

14 Claims, 11 Drawing Sheets

(a)            (b)            (c)

SEMICONDUCTOR DEVICE AND METHOD FOR MANUFACTURING SAME

CROSS-REFERENCE TO RELATED APPLICATIONS

This application is a continuation of International Application No. PCT/CN2022/085934, filed on Apr. 8, 2022, which claims priority to Chinese Patent Application No. 202210160864.4, filed on Feb. 22, 2022. The disclosures of these applications are hereby incorporated by reference in their entirety.

BACKGROUND

Resistive Random Access Memory (RRAM) is the most promising nonvolatile memory device because of its simple structure and good logic compatibility with complementary metal oxide semiconductor (CMOS). The RRAM memory cell includes a dielectric data storage layer having a variable resistor, and the resistance level of the dielectric data storage layer may be reversibly switched between different resistor states, in which each resistor state corresponds to a different data state, thereby enabling data storage.

However, with the shrinking of the feature size of semiconductor devices, the storage density of RRAM can no longer meet the needs of people.

SUMMARY

The disclosure relates to, but is not limited to, a semiconductor device and a method for manufacturing the same.

In view of this, the embodiments of the disclosure provide a semiconductor device and a method for manufacturing the same.

In a first aspect, the embodiment of the disclosure provides a semiconductor device, at least comprising a semiconductor substrate and a memory cell located on a surface of the semiconductor substrate; in which the semiconductor substrate comprises a well area, an isolation structure, a first doped area and a second doped area; the isolation structure, the first doped area and the second doped area are located in the well area, and the isolation structure is at least located between the first doped area and the second doped area; the memory cell is located on a top surface of the second doped area and is electrically connected with the second doped area.

In a second aspect, the embodiment of the disclosure provides a method for manufacturing a semiconductor device, the method comprises: providing a semiconductor substrate; forming a well area in the semiconductor substrate; forming, in the well area, a first doped area, a second doped area and an isolation structure at least being located between the first doped area and the second doped area; forming a memory cell on a top surface of the second doped area.

BRIEF DESCRIPTION OF THE DRAWINGS

In the accompanying drawings (which are not necessarily drawn to scale), the similar reference numerals may describe similar components in different views. The similar reference numerals with different letter suffixes may denote different examples of similar components. The drawings generally illustrate various embodiments discussed herein by way of example and not limitation.

DETAILED DESCRIPTION

Figure 1:
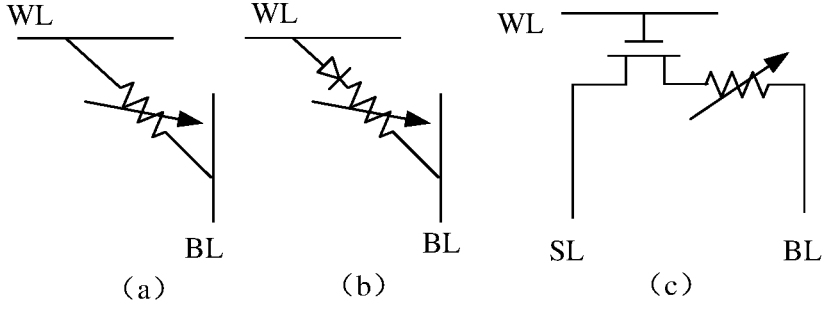
FIG. 1 is a principle diagram of three basic cells of RRAM.

Exemplary implementation of the embodiments of the present disclosure will be described in more detail below with reference to the accompanying drawings. Although exemplary embodiments of the present disclosure are shown in the drawings, it should be understood that the present disclosure may be embodied in various forms which will not be limited to the specific embodiments set forth herein. Rather these embodiments are provided so that the disclosure will be more thoroughly understood and the scope of the disclosure will be fully conveyed to those skilled in the art.

In the description of the context, numerous specific details are given to provide a more thorough understanding of the disclosure. However, it will be apparent to those skilled in the art that the present disclosure may be embodied without one or more of these details. In other examples, some technical features well known in the art are not described in order to avoid confusion with the present disclosure; that is, not all of the features of the actual embodiment are described herein and well-known functions and structures are not described in detail.

In the drawings, the dimensions of layers, regions, elements and their relative dimensions may be exaggerated for clarity. Throughout the description, the same reference numeral denotes the same element.

It should be understood that when an element or layer is referred to as "on", "adjacent to", "connected to" or "coupled to" another element or layer, it may be directly on the other element or layer, adjacent to the other element or layer, or connected to or coupled to the other element or layer, or there may be an intermediate element or layer. In contrast, when an element is referred to as "directly on", "directly adjacent to", "directly connected to" or "directly coupled to" another element or layer, there is no intermediate element or layer. It should be understood that although the terms, "first", "second", "third" and the like may be used to describe various elements, components, regions, layers, and/or portions, these elements, components, regions, layers, and/or portions should not be limited by these terms. These terms are only used to distinguish one element, component, region, layer or portion from another element, component, region, layer or portion. Therefore, without departing from the teaching of the present disclosure, a first element, component, region, layer or portion discussed hereinafter may be expressed as a second element, component, region, layer or portion. While discussing a second element, component, region, layer or portion, it does not imply that a first element, component, region, layer or portion is necessarily present in the present disclosure.

The terms used herein are intended to describe specific embodiments only and are not to be a limitation to the present disclosure. As used herein, the singular forms "a/an", "one", and "the/said" are intended to include the plural forms as well, unless the context clearly dictates otherwise. It should be further understood that when terms "comprise" and/or "include" are used in the specification, it means that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

In order to better understand the semiconductor device provided by the embodiment of the present disclosure, reference may be made to FIG. 1, the RRAM memory cell may adopt three basic structures, namely, 0T1R cell (referring to FIG. 1(A)), 1D1R cell (referring to FIG. 1(B)) and 1T1R cell (refer to FIG. 1(C)); where T represents a selective transistor and R represents a resistive cell.

The structures of the RRAM array can be divided into active arrays (1T1R) and passive arrays (also known as crossbar arrays, including 0T1R or 1D1R). Herein, the minimum cell size of the 1T1R structure of an active array is determined by the size of the selective transistor, so the cell area of this integrated structure is large, and the reducibility is limited by the selective transistor T. Generally, the area of each memory cell is $6F^2$, and this planar integration method is not conducive to 3D stacking, while the passive arrays do not have these problems.

Figure 2:
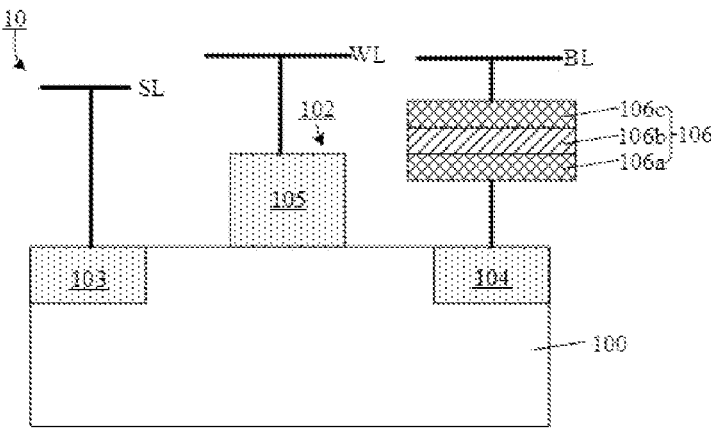
FIG. 2 is a structural schematic diagram of an RRAM memory cell implemented by 1T1R cell.

In a passive array, each memory cell is defined by upper and lower electrodes composed of a word line and a bit line intersected with each other, so that the minimum cell area of one memory cell in a planar structure is $4F^2$. FIG. 2 is a structural schematic diagram of an RRAM memory cell implemented by 1T1R cell. As shown in FIG. 2, the semiconductor device 10 includes a substrate 100, a transistor 102 located on the substrate 100, and an RRAM memory cell 106 electrically connected to the substrate 100. The transistor 102 may include a source area 103, a drain area 104, and a gate electrode 105; the RRAM memory cell 106 may include a first electrode layer 106a, a switching dielectric layer 106b and a second electrode layer 106c.

A source line SL for operating the RRAM cell 106 is electrically connected to the source area 103; a word line WL for addressing the RRAM cell 106 is electrically connected to the gate electrode 105; the first electrode layer 106a of the RRAM cell 106 is electrically connected to the drain area 104. The second electrode layer 106c of the RRAM cell 106 is electrically connected to the bit line BL.

It can be seen that a 1T1R cell is used in the semiconductor device above described, that is, a metal-oxide-semiconductor field-effect transistor (MOSFET) is used as the selective switch (i.e., the selector) of the RRAM, so that the area of each memory cell is $6F^2$, and high-density storage cannot be achieved.

In addition, at present, one semiconductor structure has only one semiconductor cell, that is, one semiconductor structure can only store one data, which further reduces the storage density of RRAM memory.

On the basis of the problem presented in the above-described semiconductor device, the embodiments of the disclosure provide a semiconductor device and a method for manufacturing the same. The semiconductor device comprises: a semiconductor substrate and a memory cell located on the surface of the semiconductor substrate. The semiconductor substrate comprises a well area, an isolation structure, a first doped area and a second doped area; in which the isolation structure, the first doped area and the second doped area are located in the well area, and the isolation structure is at least located between the first doped area and the second doped area; the memory cell is located on a top surface of the second doped area and is electrically connected with the second doped area. In the embodiments of the present disclosure, the first doped area and the second doped area isolated by the isolation structure are connected through the well area to form a selector to control the data storage process of the memory cell without forming a transistor as a selector to control the data storage process of the memory cell, thereby reducing the minimum size of the memory cell. Therefore, a semiconductor device with high storage density can be provided.

The embodiments of the present disclosure will be described in detail below with reference to the accompanying drawings.

Figure 3A:
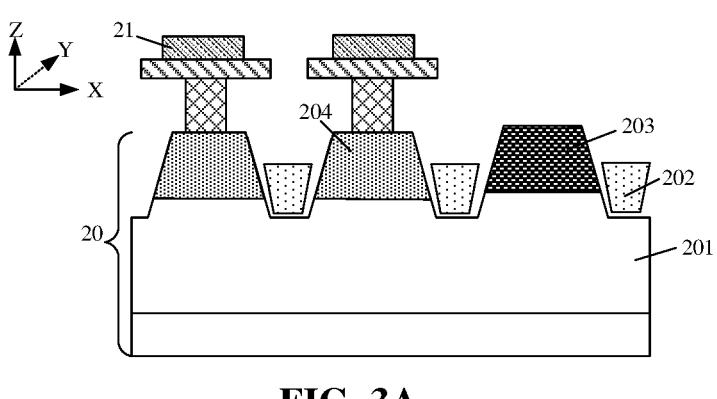
FIG. 3A is a sectional view of a semiconductor device provided by an embodiment of the present disclosure along an arrangement direction of a first doped area and a second doped area.

FIG. 3A is a sectional view of a semiconductor device provided by an embodiment of the present disclosure along an arrangement direction of a first doped area and a second doped area. As shown in FIG. 3A, the semiconductor device comprises a semiconductor substrate 20 and a memory cell 21 located on the surface of the semiconductor substrate 20.

The semiconductor substrate 20 comprises a well area 201, an isolation structure 202, a first doped area 203 and a second doped area 204; the isolation structures 202, the first doped area 203 and the second doped area 204 are located in the well area 201, and the isolation structure 202 is at least located between the first doped area 203 and the second doped area 204; the memory cell 21 is located on the top surface of the second doped area 204 and is electrically connected with the second doped area 204. When implemented, the number of the memory cell may be one or more, and the embodiments of the present disclosure are not limited thereto.

In some embodiments, the material of the semiconductor substrate may include a silicon substrate, a silicon-on-insulator substrate, a germanium substrate, a germanium-on-insulator substrate, a germanium-silicon substrate, and the like; the substrate may also include other semiconductor elements, such as germanium, or may include semiconductor compounds such as silicon carbide, gallium arsenide, gallium phosphide, indium phosphide, indium arsenide or indium antimonide; or include other semiconductor alloys such as silicon germanium, arsenic gallium phosphide, indium aluminum arsenide, gallium aluminum arsenide, indium gallium arsenide, indium gallium phosphide, and/or indium gallium arsenide phosphide or combinations thereof.

In some embodiments, the substrate may include a top surface at a front surface and a bottom surface at a back surface opposite to the front surface; a direction perpendicular to the top and bottom surfaces of the substrate is defined as a third direction in the case of ignoring the flatness of the top and bottom surfaces. A first direction and a second direction intersecting each other (e.g., perpendicular to each other) are defined in the direction of the top and bottom surface of the substrate. For convenience of description, embodiments of the present disclosure define the alignment direction of the first doped area as a first direction and the alignment direction of the second doped sub-areas as a second direction, and the planar direction of the substrate may be determined based on the first direction and the second direction. In the embodiments of the present disclosure, the plane where the first direction and the second direction are located is defined as a horizontal plane, and the first direction and the second direction have a certain included angle. For convenience of understanding, the first direction is seen as an X-axis direction, the second direction is seen as a Y-axis direction, and the third direction is seen as a Z-axis direction.

In some embodiments, the isolation structure may be a buried isolation structure or a non-buried isolation structure. The material of the isolation structure may be silicon oxide, silicon nitride or silicon oxynitride, and the function of the isolation structure may be to isolate the first doped area and the second doped area, so that the first doped area and the second doped area form a selector, i.e., a diode through the connection with the well area.

In some embodiments, the doping type of the well area may be N-type or P-type, in which the doping ions for N-type doping may include group VA ions, such as phosphorus (P), arsenic (As) or antimony (Sb), and the doping ions for P-type doping may include group IIIA ions, such as boron (B), gallium (Ga) or indium (In).

In some embodiments, the memory cell may be a RRAM memory cell, a dynamic random-access memory (DRAM) memory cell, or a static random-access memory (SRAM), and a person skilled in the art may select a desired type of the memory cell according to design requirements, which is not limited in this disclosure. It should be noted that the present disclosure mainly takes the RRAM memory cell as an example.

Figure 3B:
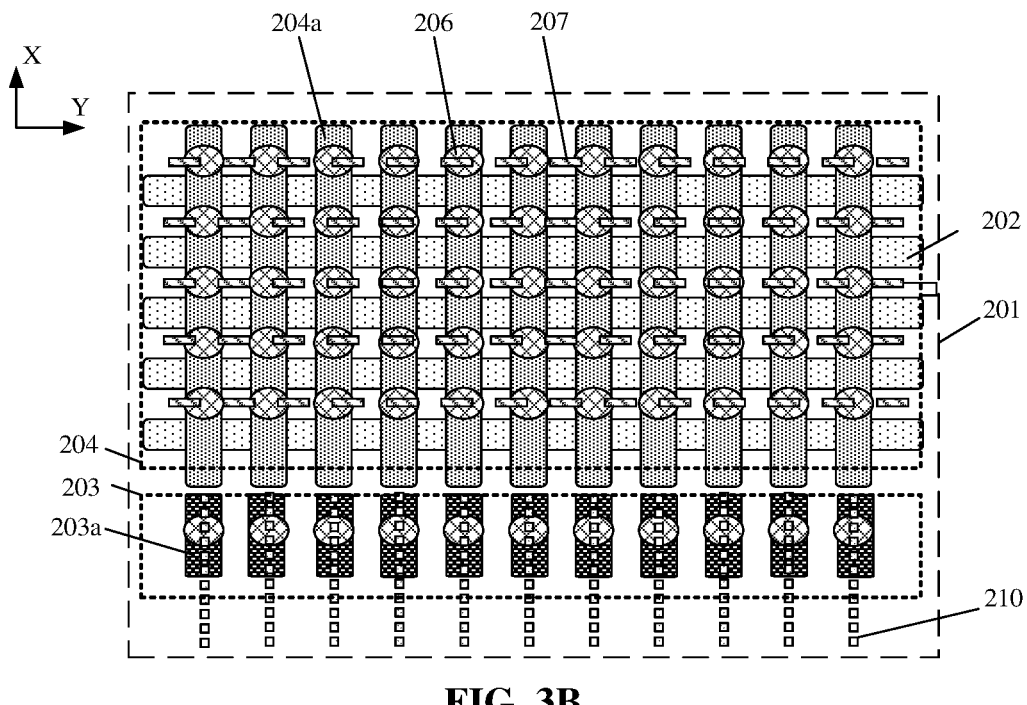
FIG. 3B is a top view of a semiconductor device provided by an embodiment of the present disclosure.
Figure 3C:
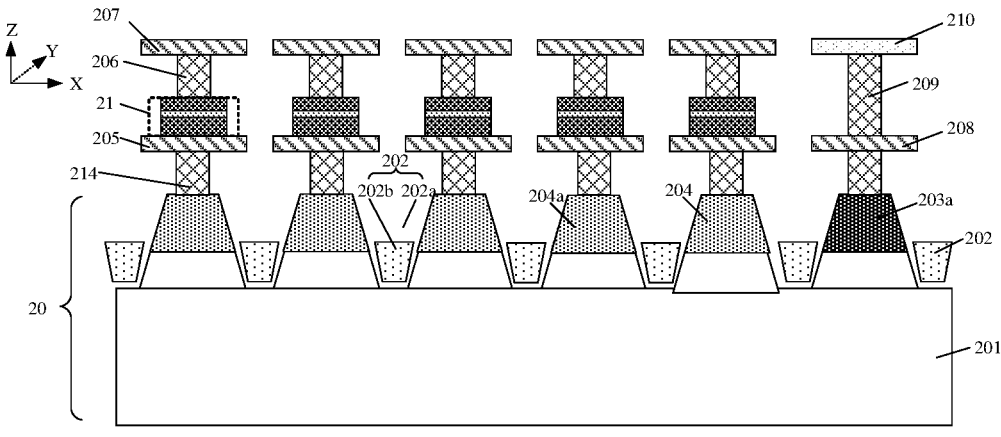
FIG. 3C is a sectional view of a semiconductor device provided by an embodiment of the present disclosure along an arrangement direction of a first doped area and a plurality of second doped areas.

In some embodiments, FIG. 3B is a top view of a semiconductor device provided by an embodiment of the present disclosure, and FIG. 3C is a sectional view of a semiconductor device provided by an embodiment of the present disclosure along an arrangement direction of the first doped area and a plurality of second doped areas. Referring to FIGS. 3B and 3C, the first doped area 203 and the second doped area 204 are arranged in the well area 201 in the first direction (X-axis direction), and the second doped area 204 comprises a plurality of second doped sub-areas 204a arranged in the first direction (X-axis direction); the memory cell 21 is formed on a top surface of each of the second doped sub-areas 204a and electrically connected with each of the second doped sub-areas 204a.

In some embodiments, referring to FIGS. 3B and 3C, the first doped area 203 comprises a plurality of first doped sub-areas 203a arranged in the second direction (Y-axis direction); the first doped sub-areas 203a and the second doped sub-areas 204a are connected through the well area 201 and form diodes, and the formed diodes are connected with the memory cells 21. In the embodiment of the present disclosure, the first doped sub-areas 203a may be P-type doped and the second doped sub-areas 204a may be N-type doped. In this case, a positive voltage may be applied to the first doped sub-areas 203a and a negative voltage may be applied to the second doped sub-areas 204a, thereby realizing normal conduction of the diode; alternatively, the first doped sub-areas 203a are N-type doped and the second doped sub-areas 204a are P-type doped. In this case, a negative voltage may be applied to the first doped sub-areas 203a and a positive voltage may be applied to the second doped sub-areas 204a, thereby realizing normal conduction of the diode.

In the embodiments of the present disclosure, the semiconductor device comprises a plurality of second doped sub-areas, and each of second doped sub-areas may be electrically connected with one memory cell, so that the semiconductor device can have a plurality of memory cells and further increase the memory density; a plurality of first doped sub-areas and a plurality of second doped sub-areas are connected through the well area to form the diodes, thereby realizing accurate selection of each memory cell and further accurate reading and writing of data.

Referring to FIG. 3B, the first doped sub-areas 203a aligned in the Y-axis direction can control at least one of the second doped sub-areas 204a aligned in the X-axis direction which is not limited in the embodiments of the present disclosure.

In some embodiments, with reference to FIG. 3B, the isolation structures 202 are also located between the adjacent two second doped sub-areas 204a for electrically isolating the adjacent two second doped sub-areas 204a to reduce leakage current generation.

In some embodiments, the isolation structure 202 may be a buried isolation structure. Referring to FIG. 3C, the top surfaces of the isolation structures 202 may be lower than the top surfaces of the first doped area and the second doped area 204. In some embodiments, the buried isolation structure may be formed by the formation process of the buried word line, thereby improving process compatibility, while also facilitating increased yields.

The buried isolation structure includes an etching trench 202a formed in the well area 201 and includes a filling layer 202b covering the etching trench. The filling material may be an insulating material or a conductive material, for example, the insulating material may be silicon dioxide, silicon nitride, or the like. The conductive material may be polysilicon or metal, such as one or more of tungsten, aluminum, copper, molybdenum, titanium, tantalum, rubidium, and may also be metal nitride, such as one or more of titanium nitride, titanium, tungsten nitride, tantalum nitride, titanium silicon nitride, tantalum silicon nitride or titanium silicon nitride.

In some embodiments, when the filling material is a conductive material, in the absence of an isolation layer, a Schottky junction may be formed between the substrate, such as a silicon substrate, and the filling layer to form a leakage current and degrade device performance. Therefore, in order to prevent leakage between the buried isolation structure and the semiconductor substrate, the isolation layer may be provided between the surface of the trench and the filling layer, and the isolation layer may be formed by depositing an insulating material.

In some embodiments, referring to FIG. 3C, the semiconductor device further comprises a first metal layer 205, and the second doped sub-area 204a and the memory cell 21 are connected through the first metal layer 205. The material of the first metal layer 205 may be any one or a combination of more of tungsten, aluminum, copper, aluminum-copper alloy, titanium, titanium nitride, tantalum, and tantalum nitride. By providing the first metal layer 205 between the second doped sub-area 204a and the memory cell 21, the contact resistance between the second doped sub-area 204a and the memory cell 21 can be reduced, thereby facilitating an increase in the conduction speed of the diode.

In some embodiments, referring simultaneously to FIGS. 3B and 3C, the semiconductor device further comprises a first via 206 and a bit line metal layer 207, in which the bit line metal layer 207 extends along the second direction (Y-axis direction), the bit line metal layer 207 may be sequentially arranged in the first direction. The bit line metal layer 207 is connected to the memory cell 21 through the first via 206, and serves as the bit line for providing a read voltage or a write voltage to the memory cell 21. Herein, the material of the bit line metal layer 207 may be any one or a combination of more of tungsten, aluminum, copper, aluminum-copper alloy, titanium, titanium nitride, tantalum, and tantalum nitride.

The first via 206 is a connection channel between the memory cell 21 and the bit line metal layer 207. The first via 206 is composed of a filling material and an initial via, and the filling material may be tungsten.

In some embodiments, the initial via may be filled by chemical vapor deposition. When implemented, the process can be divided into two operations: firstly, a nucleated tungsten seed layer is deposited in the initial via by using tungsten hexafluoride and silane; secondly, tungsten is deposited in the initial via by using tungsten hexafluoride and hydrogen. Chemical vapor deposition is beneficial to obtain good step coverage, and then the initial via is completely filled, which reduces the formation of an air gap and improves the yield of the first via.

By providing the first via 206 and the bit line metal layer 207, and connecting the bit line metal layer 207 with the memory cell 21 through the first via 206, the contact resistance between the bit line metal layer 207 and the memory cell 21 can be effectively reduced, thereby facilitating the improvement of data reading and writing speed.

In some embodiments, referring to FIG. 3C, the bit line metal layer 207 serving as a bit line is connected to the second doped sub-area 204a through the memory cell 21 and the first metal layer 205, which may allow a write voltage or a read voltage to be applied to the memory cell 21, and after the diode is turned on, data writing and reading can be realized.

In some embodiments, with reference to FIG. 3C, a connection via 214 is also provided between the memory cell 21 and the second doped sub-area 204a, and the connection via 214 may have the same structure as the first via 206 or may have a different structure from the first via 206 and is not limited herein.

Figure 3D:
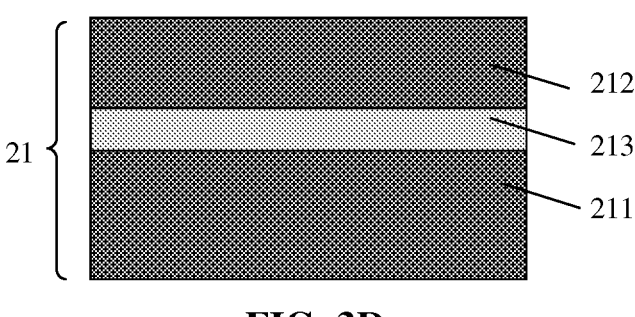
FIG. 3D is a structural schematic diagram of an RRAM memory cell provided by an embodiment of the present disclosure.

In some embodiments, FIG. 3D is an enlarged view of the memory cell in FIG. 3C. Referring to FIG. 3D, the memory cell 21 includes a first electrode layer 211, a second electrode layer 212, and a switching dielectric layer 213 between the first electrode layer 211 and the second electrode layer 212. That is, the memory cell 21 includes the first electrode layer 211, the switching dielectric layer 213 and the second electrode layer 212 sequentially from bottom to top. Referring simultaneously to FIGS. 3C and 3D, the first electrode layer 211 is connected to the second doped sub-area 204a through the first metal layer 205 and the connection via 214; the second electrode layer 212 is connected to the bit line metal layer 207 through the first via 206.

In some embodiments, the material of the first electrode layer 211 may include one or more of titanium, tantalum, titanium nitride, and tantalum nitride, or may include other metals. The material of the second electrode layer 212 may be the same as or different from that of the first electrode layer or may be different.

In some embodiments, the material of the switching dielectric layer may be a high-K dielectric material. On the one hand, the high-K dielectric material has better insulating properties and more stable chemical and physical properties. On the other hand, the high-K dielectric material has better resistive property, that is, the resistance changes under the control of an external electric field, which makes the resistive property of the switching dielectric layer better, thus improving the performance of the memory. In addition, the interface property between the high K dielectric material and a silicon substrate is good, which is beneficial to maintain good performance of the semiconductor structure.

In some embodiments, the high K dielectric material includes, but is not limited to, one or more of transition metal oxides such as hafnium oxide, alumina, titanium oxide, hafnium aluminum oxide, or zirconia.

When the memory cell 21 is selected by turning on the diode, the bit line metal layer 207, i.e., the bit line, applies a write voltage to the memory cell 21, based on the difference in the write voltage applied to the memory cell 21 by the bit line, the switching dielectric layer 213 in the memory cell 21 is converted to a low resistance state or a high resistance state, thereby completing the process of storing data, that is, a process of setting "1" or setting "0". When the data of the memory cell 21 is read, it can be read through the bit line.

In some embodiments, a plurality of switching dielectric layers 213 may be provided between the first electrode layer 211 and the second electrode layer 212. By providing the plurality of switching dielectric layers 213 between the first electrode layer 211 and the second electrode layer 212, the switching dielectric layers 213 in the memory cell 21 can appear in a low resistance state or a high resistance state with at least two different resistance values when writing data, that is, there are various resistance changes, this means that one memory cell 21 can store a variety of different data, effectively increasing the types of data storage, and further improving the storage density.

In some embodiments, the numbers of the switching dielectric layers 213 in different memory cells 21 may be the same or different. When the numbers of the switching dielectric layers 213 are different, the switching dielectric layers 213 of each memory cell 21 may have a variety of different resistance changes, that is, each memory cell 21 can store a variety of different data, which further improves the storage density.

In some embodiments, referring to FIG. 3C, the semiconductor device further comprises a second metal layer 208, and the second metal layer 208 is connected with the first doped sub-areas 203a. The material of the second metal layer 208 may be any one or a combination of more of tungsten, aluminum, copper, aluminum-copper alloy, titanium, titanium nitride, tantalum, and tantalum nitride. The arrangement of the second metal layer connected to the first doped sub-area can effectively reduce the contact resistance between the second metal layer and the first doped sub-area, and the conduction speed of the diode can be improved.

In some embodiments, with continued reference to FIG. 3C, the semiconductor device further comprises a second via 209 and a word line metal layer 210 arranged along the second direction; the word line metal layer 210 is connected with the second metal layer 208 through the second via 209. Herein, the material of the word line metal layer 210 may be any one or a combination of more of tungsten, aluminum, copper, aluminum-copper alloy, titanium, titanium nitride, tantalum, and tantalum nitride. The second via 209 is a connection channel between the word line metal layer 210 and the second metal layer 208. The filling material and the forming process of the second via 209 may be the same as or different from those of the first via 206.

Providing the word line metal layer 210 connected to the second metal layer 208 effectively reduce the contact resistance between the second metal layer and the word line metal layer.

Figure 3E:
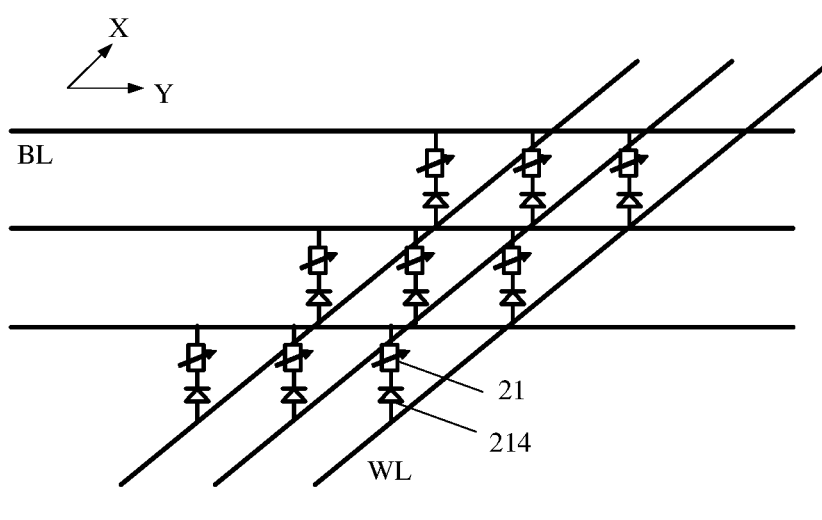
FIG. 3E is a schematic diagram of the connection of a semiconductor device provided by an embodiment of the present disclosure.

In some embodiments, referring to FIGS. 3C and 3E, the bit line metal layer 207, i.e., the bit line BL is used to provide a read voltage or a write voltage to the memory cell; the word line metal layer 210, i.e., the word line WL is connected to the first doped sub-area 203a through the second metal layer 208 for controlling the conduction of the diode and thereby writing or reading data into the memory cell 21 through the bit line BL. During implementation, when writing date to the memory cell 21, the bit line BL is turned on to control the diode to be conductive, and then a write voltage is applied to the memory cell 21 through the bit line BL, based on the difference in the write voltage applied to the memory cell 21 through the bit line BL, the switching dielectric layer 213 in the memory cell 21 is converted to a high resistance state or a low resistance state, thereby completing the process of setting "0" or setting "1". When reading out the data, the word line WL is turned on to control the diode to be conductive. Since the switching dielectric layer 213 of the memory cell 21 has two states of high resistance state or low resistance state when data is written, the current values read out by the bit line BL are different, thereby corresponding to different logic level signals.

In some embodiments, when the switching dielectric layer 213 of the memory cell 21 is in a low resistance state, a high voltage is correspondingly generated, and the bit line BL reads out the high current, thereby completing the process of setting "1"; when the switching dielectric layer 213 of the memory cell 21 is in a high resistance state, a low voltage is correspondingly generated, and the bit line BL reads out the low current, thereby completing the process of setting "0".

Figure 4A:
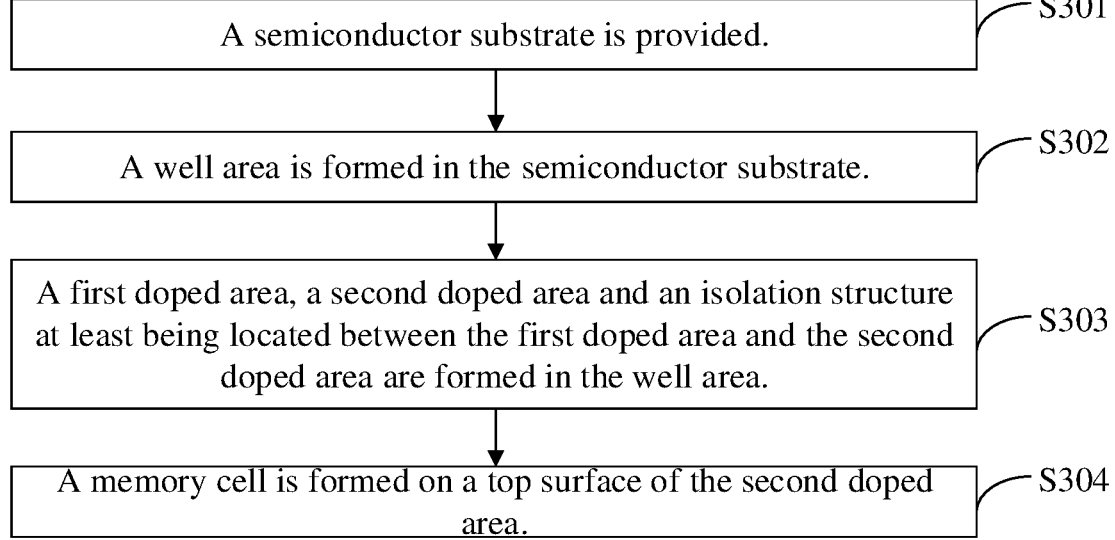
FIG. 4A is a flow chat of a method for forming a semiconductor device provided by an embodiment of the present disclosure.

Embodiments of the present disclosure provide a method for forming a semiconductor device, as shown in FIG. 4A, the method comprises the following S301 to S304.

S301: a semiconductor substrate is provided.

The semiconductor substrate may be a silicon substrate, a silicon-on-insulator substrate, a germanium substrate, a germanium-on-insulator substrate, a germanium silicon substrate, and the like.

S302: a well area is formed in the semiconductor substrate.

The well area may be formed by doping N-type ions or P-type ions in the semiconductor substrate, and the doping processes may include thermal diffusion, ion implantation, plasma doping and so on. After the doping process is completed, a high-temperature annealing may also be performed to repair the lattice damage caused by the doping process and activate impurity ions at the same time.

S303: a first doped area, a second doped area and an isolation structure at least being located between the first doped area and the second doped area are formed in the well area.

In some embodiments, S303 "a first doped area, a second doped area and an isolation structure at least being located between the first doped area and the second doped area are formed in the well area" may include the following operations.

Firstly, an etching trench is formed in the well area. When implemented, the etching trench may be formed by etching the well area, and the depth of the etching trench is less than or equal to the depth of the well area. The etching process may be dry etching or wet etching, in which dry etching may be plasma etching, reactive ion etching or ion beam milling. The gas adopted in dry etching may be one or at least two of trifluoromethane, carbon tetrafluoride, difluoromethane, hydrobromic acid, chlorine or sulfur hexafluoride; hot phosphoric acid or hydrofluoric acid may be used as etching solution for wet etching.

Next, an isolation material is filled in the etching trench to form the isolation structure. Herein, the isolation material may be a conductive material or an insulating material, which is not limited herein.

Figure 4B:
FIG. 4B is a first structural schematic diagram of a process for forming a semiconductor device provided by an embodiment of the present disclosure.
Figure 4C:
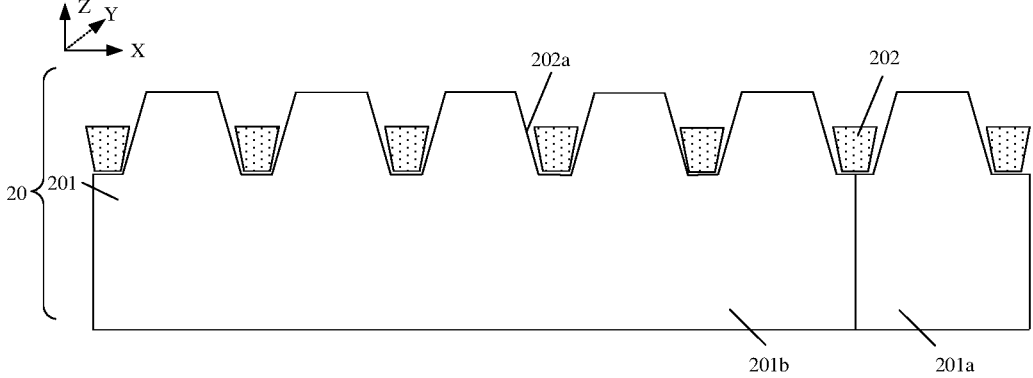
FIG. 4C is a second structural schematic diagram of a process for forming a semiconductor device provided by an embodiment of the present disclosure.

Referring to FIGS. 4B and 4C, the etching trench 202a as shown in FIG. 4C is formed in the well area 201, and an isolation structure 202 is formed by filling the etching trench 202a with an isolation material.

In some embodiments, the insulating material may be silicon oxide, silicon nitride, silicon oxynitride or the like. The method of filling with the insulating material may be any suitable deposition process, such as chemical vapor deposition, physical vapor deposition, low temperature chemical vapor deposition, low pressure chemical vapor deposition, fast thermal chemical vapor deposition, plasma chemical vapor deposition, atomic layer deposition, spin coating or coating.

In some embodiments, when the isolation material is the conductive material, in the absence of an isolation layer, a Schottky junction may be formed between the substrate, such as a silicon substrate and the filling layer to form a leakage current and thus device performance is degraded. Therefore, in order to prevent leakage current between the buried isolation structure and the semiconductor substrate, an isolation structure 202 may be formed by sequentially depositing an insulating layer and an isolation layer in the etching trench.

Finally, a first doped area and a second doped area are formed in the well area after the isolation structure is formed.

In some embodiments, the well area after forming the isolation structure includes a first area and a second area arranged in sequence along the first direction, in which an isolation structure is provided between the first area and the second area, and an isolation structure is also provided within the second area. The first area is used for forming a first doped area in a subsequent process, and the second area is used for forming a second doped area in a subsequent process. Referring to FIG. 4C, the well area 201 with an isolation structure in the substrate 20 includes a first area 201a and a second area 201b arranged at intervals in sequence along the X-axis direction, and an isolation structure 202 is provided between the first area 201a and the second area 201b.

In some embodiments, the first doped area is a P-type doped area and the second doped area is an N-type doped area, alternatively, the first doped area is an N-type doped area and the second doped area is a P-type doped area. For facilitating to understand, in the embodiments of the present disclosure, it is taken as an example for illustration that the first doped area is a P-type doped area and the second doped area is an N-type doped area.

In some embodiments, the first doped area and the second doped area are formed by the following operations.

Figure 4D:
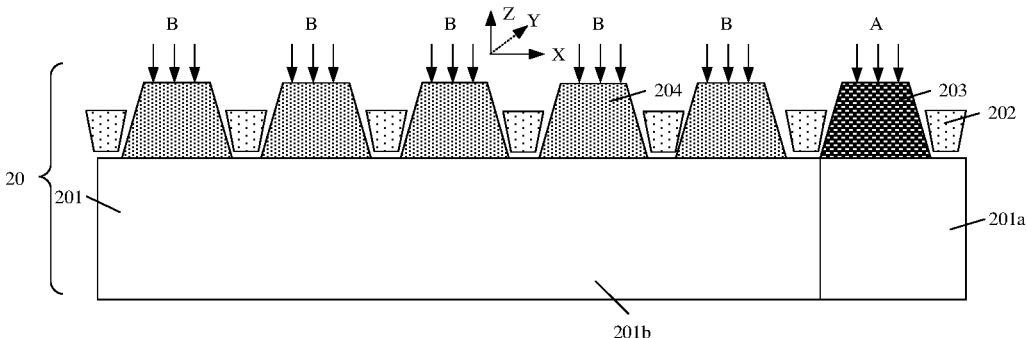
FIG. 4D is a third structural schematic diagram of a process for forming a semiconductor device provided by an embodiment of the present disclosure.

Firstly, ion doping is performed on the top of the first area 201a by adopting a first type of ions to form the first doped area 203 as shown in FIG. 4D. Arrow A represents that the first area 201*a* is doped with the first type of ions. In embodiments of the present disclosure, the first type of ions may be P-type ions such as B, Ga or In etc.

Next, referring to FIG. 4D, ion doping is performed on the top of the second area 201*b* by adopting a second type of ions to form the second doped area 204. Arrow B represents that the second area 201*b* is doped with the second type of ions. In embodiments of the present disclosure, the second type of ions may be N-type ions such as P, As or Sb etc.

In the embodiments of the present disclosure, different doping areas may adopt the same doping process or different doping processes. For example, the first doping area may adopt thermal diffusion process, and the second doping area may adopt ion implantation process, which is not limited herein.

S304: a memory cell is formed on a top surface of the second doped area. When implemented, the following operations may be included.

Firstly, a first metal layer is formed on the top surface of the second doped area.

Next, a first electrode material, a switching dielectric material, and a second electrode material are deposited sequentially on the first metal layer to form the memory cell composed of the first electrode layer, the switching dielectric layer and the second electrode layer.

In some embodiments, referring to FIGS. 3C and 3D, a first metal layer 205 is formed on the top surface of the second doped area 204, and the material of the first metal layer 205 may be one or at least two of tungsten, aluminum, copper, aluminum-copper alloy, titanium, titanium nitride, tantalum, tantalum nitride. The first metal layer 205 may be formed by any of the following processes: chemical vapor deposition, physical vapor deposition, low temperature chemical vapor deposition, low pressure chemical vapor deposition, fast thermal chemical vapor deposition, plasma chemical vapor deposition, atomic layer deposition, spin coating, or coating.

A first electrode material, a switching dielectric material, and a second electrode material are sequentially deposited on the first metal layer to form the memory cell composed of the first electrode layer 211, the switching dielectric layer 213 and the second electrode layer 212. The method of depositing the first electrode material, the switching dielectric material and the second electrode material may be any of the following process: chemical vapor deposition, physical vapor deposition, low temperature chemical vapor deposition, low pressure chemical vapor deposition, fast thermal chemical vapor deposition, plasma chemical vapor deposition, atomic layer deposition, spin coating or coating.

In some embodiments, referring to FIG. 3C, the method further includes forming a first via 206 and a bit line metal layer 207 on the second electrode layer of the memory cell 21, and the bit line metal layer 207 is connected to the second doped area 204 through the memory cell 21.

The semiconductor device provided by the embodiments of the present disclosure is used for writing data to the corresponding memory cell when the diode is turned on, or for reading data from the corresponding memory cell when the diode is turned on.

The method for manufacturing a semiconductor structure provided by the embodiments of the present disclosure is similar to the semiconductor device in the above-mentioned embodiment. Technical features not disclosed in detail in the embodiments of the present disclosure are understood with reference to the above-mentioned embodiment, and will not be repeated here.

In several embodiments provided by the present disclosure, it should be understood that the disclosed apparatus and method may be implemented in a non-targeted manner. The embodiments of a device described above are only illustrative, for example, the division of units is only a logical function division, and may be implemented in other division ways, for example, multiple units or components may be combined, or integrated into another system, or some features can be ignored or not implemented. In addition, the components shown or discussed may be coupled or directly coupled with each other.

The units described above as separate elements may or may not be physically separated, and the components displayed as a unit may or may not be a physical unit, i.e., it may be located in one place or may be distributed over multiple network units. Part or all of the units can be selected according to actual requirements to achieve the purpose of the embodiment solution.

The features disclosed in the embodiments of several methods or devices provided in the present disclosure can be arbitrarily combined without conflict to obtain a new embodiment of a method or a device.

The descriptions above are only some implementations of the embodiments of the present disclosure, and are not intended to limit the scope of protection of the embodiments of the present disclosure. Any change or replacement those skilled in the art easily think of within the technical scope of the embodiments of the present by those skilled in the art falls within the protection scope of the present disclosure. Therefore, the scope of protection of the embodiments of the present disclosure shall be subject to the scope of protection of the claims.

In the embodiment of the disclosure, the semiconductor device at least comprises a semiconductor substrate and a memory cell located on a surface of the semiconductor substrate; in which the semiconductor substrate comprises a well area, an isolation structure, a first doped area and a second doped area; the isolation structure, the first doped area and the second doped area are located in the well area, and the isolation structure is at least located between the first doped area and the second doped area; the memory cell is located on a top surface of the second doped area and are electrically connected with the second doped area. In this way, in the embodiments of the present disclosure, the first doped area and the second doped area isolated by the isolation structure are connected through the well area to form a selector to control the data storage process of the memory cell without forming a transistor as a selector, thereby reducing the minimum size of the memory cell, such that the embodiments of the present disclosure can provide a semiconductor device with high storage density.

What is claimed is:

1. A semiconductor device, at least comprising:
   a semiconductor substrate and a memory cell located on a surface of the semiconductor substrate, wherein,
   the semiconductor substrate comprises a well area, an isolation structure, a first doped area and a second doped area;
   the isolation structure, the first doped area and the second doped area are located in same well area, and the isolation structure at least is located between the first doped area and the second doped area; and
   the memory cell is located on a top surface of the second doped area and is electrically connected with the second doped area;
   the semiconductor device further comprises a first via and a bit line metal layer, wherein the bit line metal layer extends along a second direction and the bit line metal layer is sequentially arranged in a first direction, the bit line metal layer is connected with the memory cell through the first via and is configured for providing a read voltage or a write voltage to the memory cell;

wherein the first doped area and the second doped area are sequentially arranged in the well area in the first direction, and the second doped area comprises a plurality of second doped sub-areas arranged in the first direction;

the memory cell is formed on a top surface of each of the second doped sub-areas and electrically connected with each of the second doped sub-areas, wherein the bit line metal layer is connected with a second doped sub-area through the memory cell and the first metal layer.

2. The semiconductor device of claim 1, wherein the first doped area comprises a plurality of first doped sub-areas arranged in the second direction; and one first doped sub-area and one second doped sub-area are connected through the well area and form a diode, and the diode is connected with the memory cell.

3. The semiconductor device of claim 2, wherein the semiconductor device further comprises an isolation structure located between two adjacent ones of the second doped sub-areas.

4. The semiconductor device of claim 3, wherein the isolation structures comprise a buried isolation structure.

5. The semiconductor device of claim 4, further comprising a first metal layer; wherein the second doped sub-area and the memory cell are connected through the first metal layer.

6. The semiconductor device of claim 5, wherein the memory cell includes a first electrode layer, a second electrode layer, and a switching dielectric layer between the first electrode layer and the second electrode layer;

the first electrode layer is connected with the second doped sub-area through the first metal layer;

and the second electrode layer is connected with the bit line metal layer through the first via.

7. The semiconductor device of claim 6, further comprising a second metal layer;

wherein the second metal layer is connected with one first doped sub-area.

8. The semiconductor device of claim 7, further comprising a second via, and a word line metal layer arranged along the second direction; wherein the word line metal layer is connected with the second metal layer through the second via.

9. The semiconductor device of claim 8, wherein the word line metal layer is connected with one first doped sub-area through the second metal layer for turning on the diode.

10. A method for manufacturing a semiconductor device, comprising:

providing a semiconductor substrate;

forming a well area in the semiconductor substrate;

forming, in same well area, a first doped area, a second doped area and an isolation structure at least being located between the first doped area and the second doped area;

forming a memory cell on a top surface of the second doped area;

the method for manufacturing the semiconductor device further comprises, forming a first via and a bit line metal layer on the second electrode layer of the memory cell, and the bit line metal layer being connected to the second doped area through the memory cell, wherein the bit line metal layer extends along a second direction and the bit line metal layer is sequentially arranged in a first direction, the bit line metal layer is connected with the memory cell through the first via and is configured for providing a read voltage or a write voltage to the memory cell;

wherein the first doped area and the second doped area are sequentially arranged in the well area in the first direction, and the second doped area comprises a plurality of second doped sub-areas arranged in the first direction;

the memory cell is formed on a top surface of each of the second doped sub-areas and electrically connected with each of the second doped sub-areas, wherein the bit line metal layer is connected with a second doped sub-area through the memory cell and the first metal layer.

11. The method of claim 10, wherein forming, in the well area, the first doped area, the second doped area and the isolation structure at least being located between the first doped area and the second doped area comprises:

forming the isolation structure in the well area; and forming the first doped area and the second doped area in the well area after the isolation structure is formed.

12. The method of claim 11, wherein after forming the isolation structure, the well area comprises a first area and a second area sequentially spaced along the first direction; and forming the first doped area and the second doped area comprises:

performing ion doping on the first area by using a first type of ions to form the first doped area;

and performing ion doping on the second area by using a second type of ions to form the second doped area.

13. The method of claim 11, wherein forming the isolation structure in the well area comprises:

etching the well area to form an etching trench; and filling the etching trench with an isolation material to form the isolation structure.

14. The method of claim 10, wherein forming the memory cell on the top surface of the second doped area comprises:

forming a first metal layer on the top surface of the second doped area; and depositing a first electrode material, a switching dielectric material and a second electrode material sequentially on the first metal layer to form the memory cell composed of the first electrode layer, the switching dielectric layer and the second electrode layer.

* * * * *